United States Patent [19]

Telser et al.

[11] Patent Number: 5,240,815
[45] Date of Patent: Aug. 31, 1993

[54] PRODUCTION OF PHOTOPOLYMERIC FLEXOGRAPHIC RELIEF PRINTING PLATES

[75] Inventors: Thomas Telser, Weinheim; Helmut Bach, Bad Durkheim, both of Fed. Rep. of Germany

[73] Assignee: BASF Aktiengesellschaft, Ludwigshafen, Fed. Rep. of Germany

[21] Appl. No.: 720,063

[22] Filed: Jun. 24, 1991

[30] Foreign Application Priority Data

Jun. 27, 1990 [DE] Fed. Rep. of Germany ........ 4020374

[51] Int. Cl.$^5$ .............................. G03F 7/30; G03F 7/32
[52] U.S. Cl. ..................................... 430/306; 430/309; 430/325; 430/331
[58] Field of Search ................ 430/306, 309, 325, 331

[56] References Cited

U.S. PATENT DOCUMENTS

| | | | |
|---|---|---|---|
| 4,455,365 | 6/1984 | Urata et al. | 430/309 |
| 4,628,023 | 12/1986 | Cawston et al. | 430/331 |
| 4,806,452 | 2/1989 | Hoffmann et al. | 430/306 |
| 4,847,182 | 7/1989 | Worns et al. | 430/309 |
| 4,994,344 | 2/1991 | Kurtz et al. | 430/306 |
| 5,035,981 | 7/1991 | Kurtz et al. | 430/325 |
| 5,053,319 | 10/1991 | Barnett et al. | 430/331 |
| 5,061,606 | 10/1991 | Telser et al. | 430/309 |

FOREIGN PATENT DOCUMENTS

| | | |
|---|---|---|
| 2001489 | 4/1990 | Canada. |
| 2001490 | 4/1990 | Canada. |
| 2001491 | 4/1990 | Canada. |
| 0355789 | 2/1990 | European Pat. Off.. |

*Primary Examiner*—Marion E. McCamish
*Assistant Examiner*—Janis L. Dote
*Attorney, Agent, or Firm*—Keil & Weinkauf

[57] ABSTRACT

In a novel process for the production of a flexographic relief printing plate from a photosensitive recording element which contains A) a dimensionally stable substrate and
B) at least one photopolymerizable recording layer having
  b$_1$) at least one elastomeric polymer as a binder,
  b$_2$) at least one photopolymerizable monomer which is compatible with the binder (b$_1$) and
  b$_3$) at least one photopolymerizable initiator, by
(1) imagewise exposure of the photopolymerizable recording layer (B) to actinic light and
(2) washout (development) of the unexposed and therefore nonphotopolymerized parts of the imagewise exposed recording layer (B) with an organic developer with formation of a relief layer, wherein the organic developer contains from 1 pphm (1 part per 100,000,000) to 3% by weight, based on its total amount, of at least one antistatic agent.

8 Claims, No Drawings

PRODUCTION OF PHOTOPOLYMERIC FLEXOGRAPHIC RELIEF PRINTING PLATES

The present invention relates to an improved process for the production of photopolymeric flexographic relief printing plates from photosensitive recording elements which contain A) a dimensionally stable substrate and B) at least one photopolymerizable recording layer having $b_1$) at least one elastomeric polymer as a binder $b_2$) at least on photopolymerizable monomer which is compatible with the binder ($b_1$) and $b_3$) at least one photopolymerizable initiator, by (1) imagewise exposure of the photopolymerizable recording layer (B) to actinic light and (2) washout (development) of the unexposed and therefore nonphotopolymerized parts of the imagewise exposed recording layer (B) with an organic developer with formation of a relief layer.

Apart from the improvement according to the invention, a process of this type is generally known. The developers which have usually been used are (i) chlorohydrocarbons, such as chloroform, trichloroethylene, tetrachloroethylene or trichlorethane as such or as a mixture with lower alcohols, such as n-butanol;

(ii) saturated cyclic and acylic hydrocarbons, such as petroleum ether, hexane, heptane, octane, cyclohexane or methylcyclohexane;

(iii) aromatic hydrocarbons, such as benzene, toluene or xylene, or (iv) lower aliphatic ketones, such as acetone, methyl ethyl ketone or methyl isobutyl ketone.

A disadvantage of all of these known procedures is that the developer has to be allowed to act for a long time in order to achieve a satisfactory washout effect. The relief layers have frequently exhibited surface swelling, or parts of the relief have been underwashed and in certain circumstances mechanically detached. Furthermore, when conventional saturated or aromatic hydrocarbons and ketones are used, long drying times have been necessary, frequently leading to the feared positive internal finishing, ie. the finer image elements projected above the level of solid areas. Not least, these developers, apart from chlorohydrocarbons, have low flashpoints of less than 21° C., necessitating the use of special explosion-protected plants for carrying out the process. On the other hand, the use of chlorohydrocarbons has given rise to disposal problems, owing to their toxicity. Although these developers have excellent dissolving power, the photopolymeric flexographic relief printing plates which have been produced with the aid of these developers have had and unsatisfactory sidewall structure and a striking, wrinkled surface structure, ie. the orangepeel effect.

The requirements set for the performance characteristics of photopolymeric flexographic relief printing plates in practice have in the meantime steadily increased. For example, on the basis of the present expectations photopolymeric flexographic relief printing plates should be capable of being produced in a particularly simple, environmentally compatible, reliable manner from photosensitive recording elements, should reproduce the original completely true to detail after their production, should be ozone-resistant, should not have a tacky surface, should be resistant to the solvents of the usually used flexographic printing inks under pressure conditions and should give excellent printed copies in a particularly long print run. These requirements are dependent not only on the composition of the particular photosensitive recording elements used but also on the manner in which they are further processed to polymeric flexographic relief printing plates. It is therefore essential to develop the conventional procedures constantly to keep pace with the steadily growing practical requirements.

For example, EP-A-0 228 676 (U.S. Pat. No. 4,806,452) discloses a process in which branched or straight-chain, monoolefinically to triolefinically unsaturated acyclic hydrocarbons, alcohols or ketones of 8 to 15 carbon atoms and/or saturated or monoolefinically to triolefinically unsaturated cyclic aliphatic hydrocarbons, alcohols or ketones of 8 to 15 carbon atoms are used as essential components of the organic developers. Examples of suitable hydrocarbons, alcohols or ketones of 8 to 15 carbon atoms are 1-octene, cyclooctane, cyclooctene, cyclooctanol, cyclooctanone, 3-noene, mono- and sesquiterpenes and terpentine oils. Among these, the monoterpenes, for example p-menthane, borneol, menthone, D- and L-limonene, $\alpha$-terpineol, $\alpha$-terpinene, $\gamma$-terpinene, terpinolene, $\alpha$-pinene, $\Delta$-pinene, $\delta$-pinene and citronellol, are regarded as advantageous. The organic developers, which may contain one or more of these compounds, in particular limonene, contain up to about 40% by weight, based on their total amount, of other solvents. The alcohols known from the abovementioned prior art, in particular relatively high boiling alcohols, are said to be suitable in an amount of up to 20% by weight.

Although this known process can be carried out in washers which are not explosion protected and gives good to very good photopolymeric flexographic relief printing plates, the organic developers used in this process have such an intense natural odor that the process can be carried out only in particularly intensively ventilated factory rooms, a restriction which constitutes a serious disadvantage.

The process disclosed in EP-A-0 332 070 constitutes a certain advance in this respect. In this known process, hydrogenated mineral oil fractions boiling within a range of from 160° to 220° C. and having a flashpoint of greater than 45° C. are used as organic developers. These hydrogenated mineral oil fractions are said to have an aromatics content of less than 1% and a content of naphthenic hydrocarbons of from 0.5 to 50%. Such products are known and conventionally used and are sold, for example, by Exxon under the trade names or trade marks Exxsol D, Nappar, Norpar or Isopar, by Esso under the trade name or trade mark Shellsol D or by Hydrocarbures under the trade name or trade mark Hydrosol P.

These organic developers are furthermore said to contain alcohols of 4 to 8 carbon atoms, such as n-butanol, n-pentanol, isobutanol or hexanol. The content is said to be not less than 5, preferably 20%, by volume. Moreover, it is said that in addition surfactants (detergents), such as alkylsulfonates and salts thereof, alkylammonium salts, ethoxylated fatty alcohols, fatty alcohol ether sulfates nd fatty alcohol phosphoric esters and salts thereof, which however are not specified, in an amount of not more than 2% by weight, or odor-improving additives, such as limonene, pinene or citronellol, in an amount of not more than 10% by weight, may be added to this known organic developer.

Although this known process does not give rise to such serious odor problems as the process disclosed in EP-A-0 228 676 and also gives good to very good photopolymeric flexographic relief printing plates which have an excellent printing surface without orange peel and exhibit little or no swelling, the use of these organic developers may lead to a greater extent to electrostatic charging of the liquid agitated in the washer, which gives rise to serious safety problems. One of the results of this may be that the washing conditions cannot be made more stringent (for example by increasing the spray pressure or the brush speed) but instead the development has to be terminated.

U.S. Pat. No. 4,847,182 disclosed a variant of the process disclosed in EP-A-0 228 676. In this variant, nonsolvents, such an n-butanol, 2-ethoxyethanol, benzyl alcohol, ethanol, 2-butoxyethanol, isopropyl alcohol, 2-(2-butoxyethoxy)-ethanol, mineral oil, mineral spirits, naphtha, decane or octane, are added to the organic developers, which mainly consist of terpenes. These nonsolvents are said to precipitate the washed-out materials from the particular organic developer used, thus simplifying the working-up thereof. Furthermore, the use of the terpenes and the nonsolvents in the form of aqueous emulsions is recommended. As furthermore disclosed in the Examples of U.S. Pat. No. 4,847,182, large amounts of surfactants must be concomitantly used. Although electrostatic charging can no longer occur when aqueous emulsions are used, this process does not solve the problem associated with the intense odor of the terpenes used here. Moreover, the preparation of the emulsions frequently gives rise to considerable difficulties in practice because they tend to exhibit very pronounced foaming in the washers conventionally used.

EP-A-0 355 789 discloses a process for which the organic developers are selected from the following classes of compounds:

(i) diethylene glycol dialkyl ethers having alkyl groups which contain 1 to 5 carbon atoms;

(ii) esters of acetic acid with saturated alcohols of 6 to 10 carbon atoms or of alkoxy-substituted saturated alcohols of 6 to 10 carbon atoms;

(iii) esters of carboxylic acids of 6 to 10 carbon atoms with alcohols of 1 to 6 carbon atoms and (iv) esters of alkoxy-substituted carboxylic acids of 2 to 4 carbon atoms, where the alkoxy radical is of 1 to 4 carbon atoms, with an alcohol of 1 to 4 carbon atoms.

Among these, diethylene glycol diethyl ester, 3,5,5-trimethylhexyl acetate, 2-butoxyethyl acetate (butylglycol acetate), 2-ethylbutyl acetate, 2-cycloexylethyl acetate, 2-ethylhexyl acetate or mixtures thereof, ethyl octanoate, 2-pentyl hexanoate, ethyl nonanoate or ethyl 3-ethoxypropionate are said to be advantageous. Among these in turn, it is said that ethyl 3-ethoxypropionate, mixtures of nonyl acetates, 2-ethylhexyl acetate and diethylene glycol diethyl ether or mixtures of 3,5,5-trimethylhexyl acetate, 2-ethylhexyl acetate and diethylene glycol diethyl ether can be particularly preferably used. Furthermore, these organic developers are said to contain in addition from 5 to 10 per cent by volume or by weight (which is relevant here remains unclear) of alcohols, such as butanol, benzyl alcohol or 2-ethylhexanol.

In practice, the use of the esters as organic developers is very disadvantageous because each member of this class of compounds has its own typical intense fruity ester odor. This intense odor has serious adverse effects on the personnel in the reprographic unit, who after a certain time find the virtually proverbial intense ester odor unbearable. Another disadvantage of the process disclosed in EP-A-0 355 789 is that the organic developers used here result in very pronounced swelling of the developed imagewise exposed recording layers (B) and cause the highly undesirable orange peel on the printing surface of the photopolymeric flexographic relief printing plates.

These disadvantages also occur in the process disclosed in DE-A-38 36 402, which is supposed to employ esters of the general formula IV

(IV)

where $R^7$ and $R^8$ can be identical or different and are each n- or isoalkyl of 1 to 13 carbon atoms, cycloalkyl of 5, 6 or 12 carbon atoms, alkylaryl where the alkyl radical is of 1 to 3 carbon atoms and the aryl radical is of 6 carbon atoms, or aryl of 6 to 10 carbon atoms, the sum of the carbon atoms in the radicals $R^7$ and $R^8$ being from 6 to 13. In particular, amyl acetate, isoamyl acetate, hexyl acetate, cyclohexyl acetate, ethylhexyl acetate, nonyl acetate, isononyl acetate, propyl propionate, propyl butyrate, butyl butyrate, isobutyl butyrate, benzyl acetate and methyl benzoate are said to be used here, all these being compounds which have an intense odor in conjunction with low electrical conductivity.

Further processes are disclosed in DE-A-38 36 404 and DE-A-38 36 403.

In the process of DE-A-38 36, 404, phenol esters of the general formula V

(V)

where $R^9$ is n- or isoalkyl of 1 to 6 carbon atoms, cycloalkyl or aryl of 6 to 12 carbon atoms and $R^{10}$ is hydrogen or n- or isoalkyl of 1 to 6 carbon atoms or a radical —$OR^9$, are said to be used. Among these, methyl phenyl ether, ethyl phenyl ether, isopropyl phenyl ether, propyl phenyl ester, o-cresyl methyl ether, m-cresyl methyl ether, p-cresyl methyl ether, resorcinol dimethyl ether and pyrocatechol ethyl ester are supposed to be advantageous.

In comparison, the process of DE-A-38 36 403 employs aromatics of the general formula VI

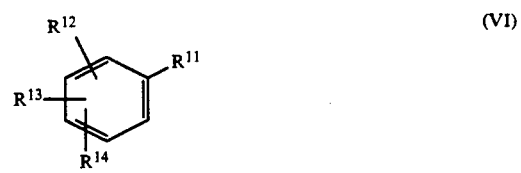

(VI)

where $R^{11}$ to $R^{14}$ may be identical or different and are each hydrogen or n- or isoalkyl of 1 to 5 carbon atoms, and, if they are directly adjacent to one another, $R^{11}$ and $R^{12}$ may furthermore form a cycloaliphatic ring having 5 or 6 ring carbon atoms, the latter preferably not being substituted and the sum of the carbon atoms of the substituents and of the ring members being from 9 to 13. among these, in particular isopropylbenzene, n-propylbenzene, 1-methyl-3-ethylbenzene, 1,3,5-trimethylbenzene, 1-methyl-2-ethylbenzene, 1,2,4-trimethylbenzene, isobutylbenzene, sec-butylbenzene, 1,2,3-trimethylbenzene, 1-methyl-4-isopropylbenzene, indane, indene, 1,3-diethylbenzene, 1-methyl-4-propylbenzene, n-butylbenzene, 1-methyl-3-propylbenzene, 1,2,4,5-tetramethylbenzene, dimethylethylbenzene, methylindene or n-pentylbenzene are used.

Although these two processes make use of compounds which do not have quite such an intense odor as the esters, some of them are nevertheless very unpleasant. Consequently, the particularly intense odor annoyance can be reduced by the esters, although only to a degree. However, there is still the serious disadvantage that the developers of DE-A-38 36 404 and of DE-A-38 36 403 are exclusively aromatic solvents which in the end will give rise to more or less major toxicological, occupational hygiene, safety and ecological problems and have extremely low electrical conductivity and hence become electrostatically charged particularly easily.

In addition, the two prior German Patent Applications P 3908764.6 and P 3908763.8, which have not been previously published, described processes of the type states at the outset, in which emulsions of organic developers and water are used. The organic developers used here are chlorohydrocarbons, saturated and/or unsaturated cyclic hydrocarbons, saturated and/or unsaturated acyclic hydrocarbons, petroleum distillates, hydrogenated mineral oil fractions and/or mixtures thereof, provided that they themselves are nonflammable, poorly flammable and/or high boiling. Mixtures of longchain alkyl ester shaving alkyl groups of different chain lengths, which however are not specified, are also suitable. These emulsions may furthermore contain from 0.1 to 20% by volume of one or more alcohols, for example n-butanol, n-pentanol, n-hexanol, cyclohexanol, n-heptanol n-octanol, n-decanol, lauryl alcohol, 3methyl-3-methoxybutanol, benzyl alcohol or 2,3,5-trimethylhexanol.

In general, the photosensitive recording elements which are suitable for the production of photopolymeric flexographic relief printing plates and which consequently are rather inaccurately referred to as flexographic printing plates by those skilled in the art have an alcohol-soluble or water-soluble top layer (C), which is present directly on the photopolymerizable recording layer (D) and prevents the photographic negative placed on the flexographic printing plate for purposes of imagewise exposure to actinic light from adhering to the surface of the photopolymerizable recording layers (B).

The alcohol-soluble top layers (C) frequently consist of a polyamide, eg. Macromelt from Henkel, whereas the water-soluble top layers (C) consist in particular of polyvinyl alcohol, eg. Mowiol from Hoechst.

Thus, either alcohols or water must be added to the organic developers to prevent the top layers (C) from being washed away in the developing step, or the top layers (C) are removed in a separate wash operation with alcohols or water, which is also referred to in the industry as prewipe.

Depending on the imagewise exposed flexographic printing plates developed and the method used for development, there are specific disadvantages which have not been overcome to date:

1. Flexographic Printing Plates Having Alcohol-Soluble Top Layers (C)

1.1 If the flexographic printing plate contains an alcohol-soluble top layer (C), in general n-butanol, isobutanol, n-pentanol or hexanol is added to the organic developers (cf. for example EP-A-0 332 070). Accordingly, these alcohols having a straight-chain alkyl radical in the molecule and a boiling point of less than 160° C. or saturated alcohols having a branched alkyl radical in the molecule, which however have a boiling point below 150° C. These alcohols dramatically reduce the flashpoint of the organic developer and have an intense unpleasant odor. Furthermore, these alcohols give rise to difficulties during working up of spent organic developers by distillation, because they have comparatively low boiling points or boiling ranges and therefore accumulate in the distillate, so that its composition must be continuously monitored and readjusted to enable the distillate to be reused as the organic developer. In industry, all this leads to serious safety, occupational hygiene and ecological problems.

1.2 If an attempt is made to counteract the consequences of the reduction of the flashpoint, of the odor annoyance or of the difference in the boiling points or boiling ranges by using higher boiling alcohols, eg. n-heptanol or n-octanol, further problems are introduced: the relevant organic developers are then substantially odorless but they are no longer capable of satisfactorily removing the top layer (C) and they very easily become electrostatically charged, which is a particularly serious disadvantage.

1.3 If an attempt is made to exclude all of these disadvantages from the outset, and to this end the alcohol-soluble top layer (C) is washed away (prewipe) with an alcohol before developing the imagewise exposed flexographic printing plate with the alcohol-free organic developer, the latter can very readily become electrostatically charged owing to its low electrical conductivity, so that this serious safety risk persists and is even present to a greater extent.

Apart from this, there is still the odor annoyance due to the alcohols during the prewipe.

2. Flexographic Printing Plates Having a Water-Soluble Top Layer (C)

2.1 If it is intended to remove the water-soluble top layers (C) during the development step, water must be added to the organic developers, as described in U.S. Pat. No. 4,847,182, the disadvantages described above in detail in the discussion of this prior art being introduced.

2.2 If, on the other hand, the water-soluble top layers (C) are removed by means of a prewipe and development is carried out thereafter using the pure organic developer, the problems described in detail in Section 1.3 are once again encountered.

Further disadvantages are clear from a consideration of the following technical situation: During washout (development) of the imagewise exposed recording layers (B), the exposed and therefore photopolymerized parts of the recording layer (B) absorb the solvent. This process is usually referred to as swelling. The extent of the swelling can be quantified by separate determination of the increase in layer thickness and/or the increase in the weight of the recording layer (B) uniformly exposed and therefore treated with the relevant developer. In practice, the swelling of the imagewise exposed and developed recording layers (B), ie. the relief layers, of the photopolymeric flexographic relief printing plates is generally from 5 to 10% by weight. Converted into layer thicknesses, this means an increase in layer thickness of from 150 to 300 μm, for example in the case of a 3 mm thick photosensitive recording layer (B) or in the case of the relief layer produced therefrom.

The drying is intended to remove the organic developer absorbed by the relief layer of the photopolymeric relief printing plate. In practice, the error is often made of ending the drying when the photopolymeric flexographic relief printing plate or its relief layer has once again reached its initial thickness or its initial weight. The fact that, during washout (development) the original imagewise exposed recording layer (B) not only absorbs organic developers but also exchanges low molecular weight constituents, for example plasticizers or other assistants, for the organic developer is overlooked. Thus, swelling and extraction take place simultaneously, so that the swelling value usually stated reflect not the swelling as such but in reality the sum of swelling and extraction.

If, in the process under discussion, an organic solvent which has a particularly pronounced extraction effect is used, and the photopolymeric flexographic relief printing plates developed therewith are dried to actual constancy of weight or of thickness, which generally requires several days, the weight or the thickness will be substantially smaller than the initial weight or the initial layer thickness, respectively, of the relief layer of the said plate.

If, on the other hand, the photopolymeric flexographic relief printing plates are dried only until the initial weight or the initial layer thickness is reached, in accordance with the conventional procedure, their relief layers inevitably still contain large amounts of organic developers. These residual solvents are, however, nonuniformly distributed in the relief layers. Thus, fine structures, for example screens having a large surface per unit volume, possess considerably higher swelling values than solid areas. This also applies to the edges of these solid areas, which swell to a greater extent than their center. Consequently, the fine structures and the edges of the solid areas in the relief layer of the photopolymeric flexographic relief printing plate project to a greater extent than, for example, the center of the solid areas. These inhomogeneities and different heights (tolerances) are also caused, and reinforced, in particular by the nonuniform temperature distribution which is always present in the drier. If these tolerances become widespread in a photopolymeric flexographic relief printing plate, they make the latter useless.

Even if the amount of residual solvent still present does not directly lead to the relevant photopolymeric flexographic relief printing plate becoming useless, it nevertheless causes long-term shrinkage, ie. the relief layer of the relevant plate changes its dimensions as a result of evaporation of the residual solvent on prolonged storage or prolonged use. Because of the long-term shrinkage, different printed copies are obtained with one and the same photopolymeric flexographic relief printing plate after prolonged storage or use, which is unacceptable in practice. This disadvantage becomes particularly acute in practice when, after prolonged use, one of the four photopolymeric flexographic relief printing plates of a flexographic four-color set can no longer be used and from now on has to be replaced by a relief printing plate which has to be newly produced, is identical in motif and in its dimensions and prints the relevant color separation in a manner exactly matching the other three color separations. However, such rapid replacement is no longer possible when the photopolymeric flexographic relief printing plates of the four-color set have suffered long-term shrinkage, because in this case the newly produced relief printing plate no longer matches the other three in its dimensions. If this is the case, all that remains is the time-consuming and expensive option of producing again all four relief printing plates of the four-color set.

Apart from the fact that it is very desirable to reduce or even to completely overcome any disadvantages of the conventional processes by varying their parameters, in particular the organic developers, it is also necessary to use other methods of measurement in checking the success. Thus, the required duration of drying should not depend on reaching the initial layer thickness or the initial layer weight but at the time when the tolerances of the relief layers of the photopolymeric relief printing plates have reached a minimum value, specification of the tolerances being supplemented by a statement of the area and of the number of measuring points on the relief layer. This information in its totality then specified a drying time during which the amount of residual solvent in the said printing plate had reached a value which no longer rendered the said printing plate less usable or completely useless under practical conditions. Without such detailed information, it is impossible to check the success, and compatibility of organic developers with one another is not ensured.

It is an object of the present invention further to develop the process state at the outset in order to obtain a novel, improved process for the production of a flexographic relief printing plate from a photosensitive recording element (flexographic printing plate) which no longer has the abovementioned disadvantages of the prior art, even taking into account exact comparison criteria.

We have found that this object is achieved, surprisingly, by the knowledge that even the addition of small amounts of an antistatic agent to the organic developers opens up novel and elegant ways for solving the problem, which were previously thought impossible and/or unlikely in view of the prior art. We have found that this object is furthermore achieved as a result of the surprising finding that the solubility of the alcohol-soluble top layer (C) in saturated alcohols having a branched alkyl radical in the molecule is very much higher than in the straight-chain homologs. Because of this finding, it is now possible, in a surprisingly simple manner, to select alcohols whose boiling point or boiling range is matched with that of the organic developer, which are virtually odorless and which reduce the flashpoint of the organic developers only very slightly, if at all.

The present invention accordingly relates to a novel process for the production of a photopolymeric flexographic relief printing plate from a photosensitive recording element which contains A) a dimensionally stable substrate and B) at least one photopolymeric recording layer having $b_1$) at least one elastomeric polymer as a binder,
  $b_2$) at least one photopolymerizable monomer which is compatible with the binder $b_1$) and
  $b_3$) at least one photopolymerizable initiator, by (1) imagewise exposure of the photopolymerizable recording layer (B) to actinic light and (2) washout (development) of the unexposed and therefore nonphotopolymerized parts of the imagewise exposed recording layer (B) with an organic developer with formation of a relief layer, wherein the organic developer used here contains from 1 pphm (1 part per 100,000,000) to 3% by weight, based on its total weight, of at least one antistatic agent.

In an advantageous variant of the novel, improved process for the production of a photopolymeric flexographic relief printing plate from a photosensitive recording element, the organic developer furthermore contains at least one virtually odorless saturated alcohol, whose boiling point or boiling range is matched with the boiling range of the developer and which has a branched alkyl radical in the molecule, and/or benzyl alcohol.

The novel, improved process for the production of a photopolymeric flexographic relief printing plate from a photosensitive recording element is referred to below as novel process for brevity.

For purposes of the present invention, compatible means the property of two or more components of being completely miscible with one another and not separating even after prolonged storage.

The essential feature, according to the invention, of the novel process is the use of an organic developer which has not been used to date for the purpose under discussion here.

The organic developer t be used according to the invention contains from 1 pphm (1 part per 100,000,000) to 3% by weight, based on its total amount, of at least one antistatic agent. This means that the content of antistatic agents in the organic developer can be varied within wide limits without the particular advantages obtained with the aid of the novel process being lost. Within this wide range, a content of antistatic agent of from 1 ppm (1 part per million) to 2% by weight has proven advantageous with regard to the performance characteristics of the relevant organic developers. According to the invention, very particularly preferably used organic developers are those whose content of antistatic agent is less than 1, advantageously 0.01, in particular 0.001%, by weight.

According to the invention, it is advantageous if the developers to be used according to the invention have an electrical conductivity $\sigma \geq 100$ pS, in particular $\geq 1000$ pS.

Antistatic agents which are suitable for the intended use according to the invention are all those which are known per se and which are soluble in the relevant organic developers and do not undergo any reactions with, or initiate reactions in, the latter or the imagewise exposed photosensitive recording elements (flexographic printing plates) to be developed.

Examples of antistatic agents which are suitable for the intended use according to the invention are (i) the tertiary amines and amides of the general formula I

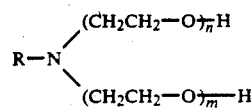

where R is $C_{12}$-$C_{18}$-alkyl, $C_{18}$-alkenyl, $C_{12}$-$C_{18}$-alkanecarbonyl or $C_{18}$-alkenecarbonyl and n and m independently of one another are each an integer of from 1 to 15;

(ii) the quarternary ammonium salts of the general formula II $$[NR^1R^2R^3R^4]_{TM} X^\ominus \qquad \text{II}$$

where $X^\ominus$ is $Cl^\ominus$, $Br^\ominus$, $I^\ominus$, $R^1$—O—$PO_3H^\ominus$, $(R^1$—O$)_2$ $PO_2^\ominus$, $R^1$—$PO_3^\ominus$, $R^1$—$SO_3^\ominus$, $R^1$—$COO^\ominus$, $CF_3SO_3^\ominus$ or $R^1$—$OSO_3^\ominus$, $R^1$ is $C_1$-$C_4$-alkyl, $R^2$ and $R^3$ are each $C_1$-$C_{20}$-alkyl or —(—$CH_2CH_2$—O—$)_n$—H, where n is an integer from 1 to 15 and $R^2$ and $R^3$ may be identical or different, and $R^4$ is —(—$CH_2CH_2$—O—$)_n$—H, where n is an integer from 1 to 15, $C_{12}$-, $C_{14}$-, or $C_{18}$-alkyl, 3-azatridecan-1-yl to 3-azadocosan-1-yl, 4-azatridecan-1-yl to 4-azadocosan-1-yl, 3-aza-4-oxotridecan-1-yl to 3-aza-4-oxadocosan-1-yl, 4-aza-5-oxotridecan-1-yl to 4-aza-5-oxodocosan-1-yl, 3-oxatridecan-1-yl to 3-oxadocosan-1-yl, 4-oxatridecan-1-yl to 4-oxadocosan-1-yl or 2-hydroxy-4-oxatridecan-1-yl to 2-hydroxy-4-oxadocosan-1-yl;

(iii) the primary ether amines of the general formula III $$R^5\text{—O—}R^6\text{—}NH_2 \qquad \text{III}$$

where $R^5$ is $C_6$-$C_{20}$-alkyl and $R^6$ is $C_2$-$C_6$-alkanediyl; and (iv) the alkali metal, alkaline earth metal and transition metal salts of aminocarboxylic acids.

Examples of advantageous radicals R in the tertiary amines and amides of the general formula I are dodecyl (=lauryl), tridecyl, tetradecyl (=myristyl), pentadecyl, hexadecyl (=palmityl), heptadecyl, octadecyl (=stearyl), oleyl, 1-oxodecan-1-yl, 1-oxotridecan-1-yl, 1-oxotetradecan-1-yl, 1-oxopentadecan-1-yl, 1-oxohexadecan-1-yl, 1-oxoheptadecan-1-yl, 1-oxooctadecan-1-yl and 1-oxooctadecan-9-en-1-yl.

The advantageous amines and amides I to be used according to the invention are generally formed by ethoxylation of amines, such as dodecylamine (=laurylamine), tridecylamine, tetradecylamine (=myristylamine), pentadecylamine, hexadecylamine (=palmitylamine), octadecylamine (=stearylamine) or oleylamine or mixtures thereof or by ethoxylation of amides, such as lauramide, tridecanecarboxamide, myrsitamide, pentadecanecarboxamide, palmitamide, heptadecanecarboxamide, stearamide or oleamide. In each case two 2-hydroxyethyl groups are bonded to a nitrogen atom, corresponding to the condition n and m=1 of the general formula I. Furthermore, however, one or two longer-chain ωhydroxypoly-(ethylene oxide)-α-yl radicals are bonded to a nitrogen atom, these radicals independently of one another having up to 15, preferably from 5 to 12, in particular from 8 to 11, ethylene oxide units. If only one long-chain radical is bonded to the nitrogen atom, the other radical is a 2-hydroxyethyl group. Bonding of two 2-hydroxyethyl groups to a nitrogen atom is preferred.

Examples of particularly advantageous tertiary amines and amides of the general formula I are accordingly N,N-bis-(2-hydroxyethyl)-N-dodecyl(=lauryl)-, -N-tridecyl-, -N-tetradecyl(=myristyl)-, -N-pentadecyl-, -N-hexadecyl-(=palmityl)-, -N-heptadecyl-, -N-stearyl- and -N-oleylamine and mixtures thereof; N,N-bis-(2-hydroxyethyl)-lauramide, -tridecanecarboxamide, -myristamide, -pentadecanecarboxamide, -palmitamide, -heptadecanecarboxamide, -stearamide and -oleamide and mixtures thereof, and all mixtures which contain these amines and amides together.

Examples of advantageous radicals $R^1$ in the quaternary ammonium salts of the general formula II are methyl, ethyl, n-propyl, isopropyl, n-butyl and isobutyl.

Examples of advantageous anions $X^\ominus$ in quaternary ammonium salts of the general formula II are chloride, bromide, iodide, $R^1$—O—$PO_3H^\ominus$, $(R^1$—O$)_2PO_2^\ominus$, $R^1$—$PO_3^\ominus$, $R^1$—$SO_3^\ominus$, $R^1$—$COO^\ominus$, $CF_3SO_3^\ominus$ and $R^1$—$OSO_3^\ominus$ where $R^1$ has the abovementioned meanings.

Examples of advantageous radicals $R^2$ and $R^3$ in the quaternary ammonium salts of the general formula II are methyl, ethyl, n-propyl, isopropyl, n-butyl, isobutyl, n-pentyl, n-hexyl, n-heptyl, n-octyl, isooctyl, n-nonyl, n-decyl, isodecyl, n-undecyl, n-dodecyl(=lauryl), n-tridecyl, n-tetradecyl(=myristyl), n-pentadecyl, n-hexadecyl(=palmityl), n-heptadecyl), stearyl, n-nonadecyl and n-eicosanyl, and 2hydroxyethyl and ω-hydroxypoly(ethylene oxide)-α-yl radicals having from 2 to 15 preferably from 5 to 12, in particular from 8 to 11, ethylene oxide units in the chain. $R^2$ and $R^3$ are identical or different.

Examples of advantageous radicals $R^4$ in the quaternary ammonium salts of the general formula II are 2-hydroxyethyl and ω-hydroxypoly-(ethylene oxide)-α-yl radicals having from 2 to 15, preferably from 5 to 12, in particular from 8 to 11, ethylene oxide units in the chain; lauryl, myristyl, palmityl and stearyl; 3-azatridecan-1-yl, 3-azatetradecan-1-yl, 3-azapentadecan-1-yl(=2-laurylaminoethyl), 3-azahexadecan-1-yl, 3-azaheptadecan-1-yl(=2-myristylaminoethyl), 3-azaoctadecan-1-yl, 3-azanonadecan-1-yl(=2-palmitylaminoethyl), 3-azaeicosan-1-yl, 3-azaheneicosan-1-yl(=2-stearylaminoethyl) and 3-azadocosan-1-yl; 4-azatridecan-1-yl, 4-azatetradecan-1-yl, 4-azapentadecan-1-yl, 4azahexadecan-1-yl(=3-laurylaminopropyl), 4-azaheptadecan-1-yl, 4-azaoctadecan-1-yl(=3-myristylaminopropyl), 4-azanonadecan-1-yl, 4-azaeicosan-1-yl(=3-palmitylaminopropyl), 4-azaheneicosan-1-yl and 4-azadocosan-1-yl or 3-stearylaminopropyl; 3-aza-4-oxotridecan-1-yl, 3-aza-4-oxotetradecan-1-yl, 3-aza-4-oxopentadecan-1-yl)=2-laurylamidoethyl), 3-aza-4-oxohexadecan-1-yl, 3-aza-4-oxoheptadecan-1-yl(=2-myristylamidoethyl), 3-aza-4-oxooctadecan-1-yl, 3-aza-4-oxo-nonadecan-1-yl(=2-palmitylamidoethyl), 3-aza-4-oxoeicosan-1-yl, 3-aza-4-oxoheneicosan-1-yl)(=2-stearylamidoethyl) and 3-aza-4-oxodocosan-1-yl; 4-aza-5-oxotridecan-1-yl, 4-aza-5-oxotetradecan-1-yl, 4-aza-5-oxopentadecan-1-yl, 4-aza-5-oxohexadecan-1-yl(=3-laurylamidopropyl), 4-aza-5-oxoheptadecan-1-yl, 4-aza-5-oxooctadecan-1-yl-(=3-myristylamidopropyl), 4-aza-5-oxononadecan-1-yl, 4-aza-5-oxoeicosan-1-yl(=3-palmitylamidopropyl), 4-aza-5-oxoheneicosan-1-yl and 4-aza-5-oxodocosan-1-yl or 3-stearylamidopropyl; 3-oxatridecan-1-yl, 3-oxatetradecan-1-yl, 3-oxapentadecan-1-yl(=2-lauryloxyethyl), 3-oxahexadecan-1-yl, 3-oxaheptadecan-1-yl(=2-myristyloxyethyl), 3-oxaoctadecan-1-yl, 3-oxanonadecan-1-yl(=2-palmityloxyethyl), 3-oxaeicosan-1-yl, 3-oxaheneicosan-1-yl(=2stearyloxyethyl) and 3-oxadocosan-1-yl radicals; 4-oxatridecan-1-yl, 4-oxatetradecan-1-yl, 4-oxapentadecan-1-yl, 4-oxahexadecan-1-yl(=3-lauryloxypropyl), 4-oxaheptadecan-1-yl, 4-oxaoctadecan-1-yl(=3-myristyloxypropyl), 4-oxanonadecan-1-yl, 4-oxoeicosan-1-yl(=3-palmityloxypropyl), 4-oxaheneicosan-1-yl and 4-oxadocosan-1-yl or 3-stearyloxypropyl radicals; and 2-hydroxy-4-oxatridecan-1-yl, 2-hydroxy-4-oxatetradecan-1-yl, 2-hydroxy-4-oxapentadecan-1-yl, 2-hydroxy-4-oxaoctadecan-1-yl, 2-hydroxy-4-oxaheptadecan-1-yl, 2-hydroxy-4-oxaoctadecan-1-yl(=3-myristyloxy-2-hydroxypropyl), 2-hydroxy-4-oxanonadecan-1-yl, 2-hydroxy-4-oxaeicosan-1-yl(=3-palmityloxy-2-hydroxypropyl), 2-hydroxy-4-oxaheneicosan-1-yl and 2-hydroxy-4-oxadocosan-1-yl or 3-stearyloxy-2-hydroxypropyl radicals.

Examples of radicals $R^1$ which are particularly advantageously used quaternary ammonium salts of the general formula II are methyl and ethyl.

Examples of radicals $R^2$ and $R^3$ which are particularly advantageously used in the quaternary ammonium salts of the general formula II are methyl, ethyl, lauryl, myristyl, palmityl, stearyl and 2-hydroxyethyl.

Examples of radicals $R^4$ which are particularly advantageously used in the quaternary ammonium salts of the general formula Ii are 2-hydroxyethyl, lauryl, myristyl, palmityl, stearyl, 2-laurylaminoethyl, 2-myristylaminoethyl, 2-palmitylaminoethyl, 2-stearylaminoethyl, 3-laurylaminopropyl, 3-myristylaminopropyl, 3-stearylaminopropyl, 2-laurylaminoethyl, 2-myristylamidoethyl, 2-palmitylamidoethyl, 2-stearylamidoethyl, 3-laurylamidopropyl, 3-myristylamidopropyl, 3-palmitylamidopropyl, 3-stearylamidopropyl, 2-lauryloxyethyl, 2-myristyloxyethyl, 2-palmityloxyethyl, 2-stearyloxyethyl, 3-lauryloxypropyl, 3myristyloxypropyl, 3-stearyloxypropyl, 3-lauryloxy-2-hydroxypropyl, 3-myristyloxy-2-hydroxypropyl, 3-palmityloxy-2-hydroxypropyl, and 3-stearyloxy-2-hydroxypropyl radicals.

The anion which is particularly advantageously used in the quaternary ammonium salts of the general formula II is ethylsulfate.

Examples of particularly advantageous quaternary ammonium salts of the general formula II which are to be used according to the invention are: N-methyl-N,N-bis-(2-hydroxyethyl)-N-lauryl-, -N-myristyl-, -N-palmityl- and -N-stearylammonium ethylsulfate; N-methyl-N,N-bis-(2-hydroxyethyl)-N-(2-laurylaminoethyl)-, -N-(2-myristylaminoethyl)-, -N-(2-palmitylaminoethyl)- and -N-(2-stearylaminoethyl)-ammonium ethylsulfate; N,N-dimethyl-N-(2-hydroxyethyl)-N-(3-laurylaminopropyl)-, -N-(3-myristylaminopropyl)-, -N-(3-palmitylaminopropyl)- and -N-(3-stearylaminopropyl)-ammonium ethylsulfate; N,N,N-trimethyl-N-(2-hydroxyethyl)-ammonium ethylsulfate; N,N-dimethyl-N-(2-hydroxyethyl-N-(2-laurylamidoethyl)-, -N-(2-myristylamidoethyl)-, -N-(2-palmitylamidoethyl)- and -N-(2-stearylamidoethyl)-ammonium ethylsulfate; N,N-dimethyl-N-(2-hydroxyethyl)-N-(3-laurylamidopropyl)-, -N-(3-myristylamidopropyl)-, -N-(3-palmitylamidopropyl)- and -N-(3-stearylamidopropyl)-ammonium ethylsulfate; N-methyl-N,N-bis-(2-hydroxyethyl)-N-(2-lauryloxyethyl)-, -N-(2-myristyloxyethyl)-, -N-(2-palmityloxyethyl)- and -N-(2-stearyloxyethyl)-ammonium ethylsulfate; N,N-dimethyl-N-(2-hydroxyethyl)-N-(3-lauryloxypropyl)-, -N-(3-myristyloxypropyl)-, -N-(3-palmityloxypropyl)- and -N-(3-stearyloxypropyl)-ammonium ethylsulfate; N-methyl-N,N-bis-(2-hydroxyethyl)-N-(3-lauryloxy-2-hydroxypropyl)-, -N-(3-myristyloxy-2-hydroxypropyl)-, -N-(3-palmityloxy-2-hydroxypropyl)- and -N-(3-stearyloxy-2-hydroxypropyl)-ammonium ethylsulfate and N,N-dimethyl-N-(2-hydroxyethyl)-N-(3-lauryloxy-2-hydroxypropyl)-, -N-(3-myristyloxy-2-hydroxypropyl)-

, -N-(3-palmityloxy-2-hydroxypropyl)- and -N-(3-stearyloxy-2-hydroxypropyl)-ammonium ethylsulfate.

The quaternary ammonium salts of the general formula II are used individually or as a mixture of a plurality of the ammonium salts. They are also employed as mixtures with tertiary amines and amides of the general formula I. However, it is particularly advantageous to use the tertiary amines and amides I or the quaternary ammonium salts II separately. It is very particularly advantageous to use mixtures of tertiary amines and amides I or mixtures of quaternary ammonium salts II. Such mixtures are known and are commercially available. For example, Georg M. Langer und Co. sell mixtures and solutions of quaternary ammonium salts of the general formula II under the trade names Catafor$\phi$ CA 100, CA 80 (solution in butanol), BCA 100 or BCA 80 (solution in butanol) and tertiary amines and amides of the general formula I under the trade name Catafor ® 06. These amines and amides I are also commercially available under trade marks such as Armostat ® 600 from Akzo or Antistatikum ® Hoechst VP FA 14 from Hoechst.

Examples of advantageous radicals $R^5$ in the primary ether amines or the general formula III are the $C_6$–$C_{20}$-alkyl radicals stated above for $R^2$ or $R^3$.

Examples of advantageous radicals $R^6$ in the primary ether amines of the general formula III are ethane-1,2-diyl, propane-1,3-diyl and butane-1,4-diyl.

Examples of particularly advantageous primary ether amines of the general formula III which are to be used according to the invention are 3-hexyloxyprop-1-ylamine and 3-isodecyloxyprop-1-ylamine, the former being very particularly advantageous.

Examples of advantageous alkali metal, alkaline earth metal and transition metal salts of aminocarboxylic acids are the alkali metal, alkaline earth metal or transition metal salts of anthranilic acid and of alanine.

Examples of very particularly advantageous salts of anthranilic acid and alanine are chromium anthranilate and calcium semialanate, which can be used individually or as a mixture. The industrial mixtures of these two salts, which additionally contain an antioxidant and which are already in solution in a paraffin mixture have proven very particularly advantageous here. These industrial mixtures are generally known and are commercially available under the trade names or trade marks ASA 3 from Shell or Kerostat ® 50.09 from BASF.

In a particularly advantageous variant of the novel process, the organic developer contains benzyl alcohol and/or at least one virtually odorless saturated alcohol, whose boiling point or boiling range is matched with the boiling range of the organic developer and which has a branched alkyl radical in the molecule. This alcohol is advantageously present in the organic developer in an amount of from 5 to 50, advantageously from 5 to 30, in particular from 10 to 25%, by volume. Examples of suitable alcohols, in addition to benzyl alcohol, are isoheptanol, isooctanol, isononanol, 3,5,5-trimethylhexanol, 2-ethylhexanol and the industrial mixtures of branched alcohols which are sold by Exxon under the trade name or trade mark Exxal 7, 8 and 9. These alcohols boil at above 150° C. and have only a low vapor pressure at room temperature. Their odor is substantially fainter compared with n-butanol or n-pentanol.

Suitable organic developers for the novel process are all organic solvents and solvent mixtures which are capable of dissolving or superficially swelling the unexposed and therefore nonphotopolymerized parts of the imagewise exposed recording layers (B) of photosensitive recording elements. Among these developers, those which are nonflammable, poorly flammable and/or high boiling are particularly suitable and are exclusively used. Here, nonflammable means that the relevant organic developer alone cannot support combustion under the oxygen partial pressure of the air. Poorly flammable means that the organic developer alone has a flashpoint above 45° C., preferably 50° C., according to DIN 51,755 or DIN 51,758. High boiling means that the relevant organic developer has a boiling point or boiling range above 120° C., preferably 150° C., in particular 160° C.

Examples of very particularly suitable organic developers are chlorohydrocarbons, saturated and/or unsaturated cyclic hydrocarbons, saturated and/or unsaturated acyclic hydrocarbons, petroleum distillates, mineral oil fractions from which aromatics have been removed, alkyl and alkoxyalkyl acetates, alkyl and alkoxyalkyl glycolates, alkyl and alkoxyalkyl esters of higher saturated aliphatic carboxylic acids which may be alkoxy-substituted, dialkylene glycol dialkyl ethers and/or mixtures thereof, provided that they are substantially odorless, nonflammable or poorly flammable and/or high boiling. Among these, the mineral oil fractions from which aromatics have been removed and which have this property profile are preferably used because they are particularly advantageous.

Very particularly advantageous mineral oil fractions from which aromatics have been removed are hydrogenated mineral oil fractions. Examples of hydrogenated mineral oil fractions to be used according to the invention are mineral spirits which have a boiling range of from 150° to 220° C., a flashpoint above 45° C., an aromatic content of less than 1%, a content of naphthenic hydrocarbons of 35% and a content of paraffins greater than 64%; synthetic isoparaffins which have a boiling range of from 180° to 220° C. and a content of paraffins greater than 99%; mineral spirits which have a boiling range of from 170° to 260° C., a flashpoint above 60° C., an aromatics content of 13% and a content of naphthenic hydrocarbons of 10% and a paraffin content of 77%; n-paraffin fractions which have a boiling range of from 80° to 230° C., a flashpoint above 55° C., an aromatics content of less than 0.1% and a paraffin content greater than 99.9%; hydrogenated mineral oils which have a boiling range of from 220° to 260° C., a flashpoint of 90° C. or higher, an aromatics content of 3%, a content of naphthenic hydrocarbons of 31% and a paraffin content of 66%. Among these, hydrogenated mineral oil fractions which have a boiling range of from 150°0 to 220° C. and an aromatics content of less than 1% are preferred.

These hydrogenated mineral oil fractions are conventional commercial products and, as stated at the outset, are sold by the companies Exxon, Shell and Hydrocarbures.

Pure substances, for example decahydronaphthalene, are also suitable. However, the hydrogenated mineral oil fractions of the Exxol D and Shellsol D series are particularly preferably employed for the intended use according to the invention.

In terms of the method, the novel process has no special features, ie. the photopolymerizable recording layer (B) of a photosensitive recording element is exposed imagewise in a conventional manner and then developed by washing out the unexposed and therefore nonphotopolymerized parts with the developers described above and to be used according to the invention, in the known spray and brush washers at from 20° to 60° C., in particular from 20° to 35° C. This alone constitutes an advantage of the novel process which should not be underestimated and which lies in the fact that an explosion-protected washer need not be used. Furthermore, the washers need no longer have a safety cut-out which switches off the washer when the operating temperature exceeds 40° C. On the contrary, higher operating temperature can be used in the washer in the novel process. Another advantage which should not be underestimated is that the washout conditions can be made more stringent without any risk of dangerous electrostatic charging of the organic developer to be used according to the invention. For example, the spray pressure, the brush speed or the friction in the washers can be increased beyond the level known to data if it is advantageous for the relevant process according to the invention. The novel process thus permits more rapid development of imagewise exposed recording layers (B) than was possible to date, and the optimal washout times of the novel process are therefore substantially shorter than those of the known procedures. In contrast to the conventional procedures, the most stringent operating conditions in the washers can be compensated and optimized by varying the dissolution power of the novel organic developer in such a way that overwashing, ie. fragmentation of material from the relief layer of the photopolymeric flexographic relief printing plates by mechanical action (edge fragmentation), does not occur when the optimum washout times are exceeded. The optimum washout time is the time in which the desired or the maximum relief is just reached during washout. Because of the simpler mutual matching of the operating conditions of the washer and of the dissolution power of the organic developer, which is not possible, the optimum washout time of a given imagewise exposed recording layer (B) is even further reduced compared to the prior art. Since, in the novel process, in particular substantially odorless organic developers are used, the operating temperatures of the washer can be substantially increased compared with the known procedures without giving rise to odor annoyances for the operator in the reprographic unit. An additional surprising advantage of the novel process is that, even after prolonged operation, no deposits occur in the washers and on the photopolymeric flexographic relief printing plates produced.

Moreover, the spent organic developers used according to the invention, in particular those based on hydrogenated mineral oil fractions, can be worked up in a particularly simple manner by distillation under reduced pressure and reused for the intended use according to the invention. If these hydrogenated mineral oil fractions contain synthetic ether amines of the general formula III having a molecular weight which is not too high, for example 3-hexyloxyprop-1-ylamine, as antistatic agents, the composition of the distillate is unchanged compared with the original composition of the organic developer so that further metering of the antistatic agents is unnecessary.

The photopolymeric flexographic relief printing plates produced with the aid of the novel process, or relief layers thereof, have a more pronounced height and a very good sidewall structure, the surface of these relief layers surprisingly being substantially smoother and more uniform than the surface of relief layers which have been produced by the known procedures. In particular, the relief layers produced by the novel process no longer have any orange peel. In addition, the swelling of the image elements in the relief layers is substantially less than when conventional developers are used, and the photopolymeric flexographic relief printing plates produced in the novel procedure have substantially less tendency to crack.

In carrying out the novel process, washing away any alcohol-soluble or water-soluble top layer (C) present can precede the actual development step, this being known as prewipe. This prewipe is carried out in particular in the case of imagewise exposed photosensitive recording elements having water-soluble top layer (C).

When the novel process is carried out, the development step and any prewipe are preceded by conventional imagewise exposure of the photosensitive recording element or of its photopolymerizable recording layer (B) to actinic light having a wavelength $\lambda$ of from 230 to 450 nm, in particular from 300 to 450 nm. Examples of light sources suitable for this purpose are sunlight, conventional UV fluorescent tubes, medium pressure, high pressure and low pressure mercury lamps, superactinic fluorescent tubes, pulsed xenon lamps, lamps doped with metal iodides or carbon arc lamps.

The development step is followed in the further course of the novel process by drying of the resulting photopolymeric flexographic relief printing plates. Drying is advantageously carried out in driers, for example through-circulation driers, at above room temperature, in particular above 40° C. Drying of the photopolymeric flexographic relief printing plates resulting from the novel process is advantageously carried out until the tolerances in their relief layers have reached $\leq 20$ $\mu$m, in particular $\leq 15$ $\mu$m. Thereafter, the said printing plates also no longer exhibit any long-term shrinkage, which forms the basis of their excellent reusability.

The tolerances of the relief layers are advantageously determined separately in solid areas of size DIN A3 at 40 measuring points.

The photopolymeric flexographic relief printing plates obtained in the novel procedure can then be halogenated in halogen-containing or halogen-donating baths, subsequently washed in reducing baths and dried again. Alternatively to this treatment or thereafter, the photopolymeric flexographic relief printing plates can be exposed uniformly to actinic light, in particular light having a wavelength $\lambda$ of $\leq 250$ nm.

Another advantage of the novel process is that it can be carried out successfully using many known photosensitive recording elements or flexographic printing plates suitable for the production of photopolymeric flexographic relief printing plates. Such known photosensitive recording elements comprise A) a dimensionally stable substrate and B) at least one photopolymerizable photosensitive recording layer which contains $b_1$) at least one elastomeric polymer as a binder, $b_2$) at least one photopolymerizable monomer which is compatible with the polymeric binder ($b_1$) and $b_3$) at least one photopolymerization initiator, and are also referred to, somewhat inaccurately, as flexographic printing plates by those skilled in the art.

The photopolymerizable recording layers (B) of these flexographic printing plates may furthermore contain, in addition to the essential components ($b_1$), ($b_2$) and ($b_3$), suitable additives, such as thermal polymerization inhibitors, dyes, pigments, photochromic substances, antihalation agents, plasticizers, antioxidants, antiozonants, agents for improving the relief structure, crosslinking agents, flow improvers, parting agents, fillers and/or reinforcing fillers, in effective amounts. Flexographic printing plates may contain a plurality of these photopolymerizable recording layers (B) one on top of the other and firmly bonded to one another, and these layers (B) may have the same or roughly the same composition or different compositions. The photosensitive recording element may furthermore contain one of the conventional top layers (C) stated at the outset.

Another great advantage of the novel process is that the organic developers to be used according to the invention can be employed successfully for many known photopolymerizable photosensitive recording layers (B).

For example, short washout times results in the case of photopolymerizable photosensitive recording layers (B) which contain, as binders ($b_1$), vinylaromatic/alkadiene block copolymers (styrene-isoprene-styrene, styrene-butadiene-styrene, styrene-isoprene-styrene-butadiene, etc.), alkadiene/acrylonitrile copolymers (butadiene/acrylonitrile), fluorine rubbers (vinylidene chloride/hexafluoropropylene copolymer), natural rubbers, silicone polymers, polysulfide rubbers or ethylene/propylene/diene terpolymers.

The photopolymeric flexographic relief printing plates produced by the novel process are outstandingly suitable for continuous printing after being clamped on printing cylinders. They prove to be extremely stable to the solvents of the flexographic printing inks usually used and give excellent printed copies in particularly long print runs. After use, they can be stored for a relatively long time and then reused without there being any danger of a change in the printed image.

EXAMPLES AND COMPARATIVE EXPERIMENTS

Examples 1 to 3 and Comparative Experiments V1 to V3

Production of photopolymeric flexographic relief printing plates by the novel process (Examples 1 to 3) and by known processes (Comparative Experiments V1 to V3)

General Experimental Method

Commercial flexographic printing plates (photosensitive recording element) were used for Examples 1 to 3 and Comparative Experiments V1 to V3. These contain, as substrate film (A), a 125 $\mu$m thick polyethylene terephthalate film, which was coated with a 0.3 $\mu$m thick polyurethane adhesion-promoting layer prior to application of the photopolymerizable recording layer (B). The 2900 $\mu$m thick photopolymerizable recording layer (B) of these flexographic printing plates consisted of 82.616% by weight of a block copolymer XYZ having a viscosity number of 164.9 ml/g and a total molecular weight of 190,000 and consisting of 10% by weight of polystyrene as the X block, 70% by weight of polyisoprene having a glass transition temperature $T_g$ of $-53°$ C., as the Y block, and 20% by weight of polyisoprene containing 53% by weight of 3,4-structures and having a glass transition temperature $T_g$ of $+10°$ C., as the Z block, the percentages being based on XYZ, 5% by weight of white oil S 5000, 5% by weight of a copolymer of $\alpha$-methylstyrene (10% by weight) and p-methylstyrene (90% by weight), having a weight average molecular weight $M_w$ of $9.10^3$, 3.33% by weight of hexane-1,6-diol diacrylate, 1.65% by weight of hexane-1,6-diol dimethyacrylate, 1.2% by weight of benzil dimethyl acetal, 0.198% by weight of 2,6-di-tert-butyl-p-cresol, 1.00% by weight of the antiozonant was Antilux ® 550 from Rheinchemie and 0.006% by weight of the dye Solvent Black (C.I. 26,150).

The flexographic printing plates of Example 1 and of Comparative Experiments V1 and V3 furthermore contained a 2 $\mu$m thick top layer (C) of an alcohol-soluble polyamide (Makromelt ® 6900 from Henkel), and the flexographic printing plates of Examples 2 and 3 and of Comparative Experiment V2 contained a water-soluble, 3 $\mu$m thick top layer (C) of the polyvinyl alcohol Mowiol ® 04 M1 from Hoechst. This water-soluble top layer (C) was washed away in a prewipe step with the aid of a sponge soaked in pure water, before the actual development.

The flexographic printing plates were first preexposed uniformly for 2 minutes through their back in a tube exposure unit, then exposed imagewise for 12 minutes through a test negative placed on the top layer (C) and thereafter developed under identical conditions at 30° C. in the non-explosion-protected drum brush washer nyloflex ® F II from BASF in the novel manner (Examples 1 to 3) and in the conventional manner (Comparative Experiments V1 to V3), the washout time required in each case for achieving a relief height of 800 $\mu$m being determined (=optimum washout time).

The resulting photopolymeric flexographic relief printing plates were then dried in a through-circulation drier at 60° C. The time after which the relief layers had again achieved their initial layer thickness (2900 $\mu$m) was determined. Thereafter, if at all necessary, drying was continued until the relief layers of said printing plate reached tolerances of $\leq 20$ $\mu$m or less. The drying time required for this purpose was determined for each flexographic printing plate and for each developer separately using flexographic printing plates which had been uniformly exposed and otherwise treated as described above and which were of size DIN A3, at 40 measuring points, where the layer thickness and the tolerances were measured as a function of the drying time.

Furthermore, careful attention was paid to any odor annoyance and a check was carried out to determine whether, after the washout, residues of the alcohol-soluble top layer (C) were still present on the surface of the photopolymeric flexographic relief printing plates of Example 1 and of Comparative Experiments V1 and V3. Furthermore, working up of the spent organic developers was tested. Not least, the flashpoints of the organic developers were determined according to DIN 51,755 for flashpoints below 50° C. and according to DIN 51,758 for flashpoints above 50° C.

The Table gives an overview of the organic developers used and the experimental results obtained.

In the Table, the abbreviations have the following meanings:

a) Ex=Exxsol D 60 from Esso, b) TMH=3,5,5-trimethylhexanol, c) P=n-pentanol, d) ASA 3=a mixture of chromiumanthranilate, calcium, semianalate and an antioxidant, dissolved in a paraffin mixture, antistatic agent from Shell, e) EH=2-ethylhexanol and f) PA-10=3-hexyloxyprop-1ylamine, antistatic agent from Exxon.

duced by the novel procedure had no residues of alcohol-soluble top layer (C) and no orange peel.

TABLE

Production of photopolymeric flexographic relief printing plates by the novel (Examples 1 to 3) and conventional (Comparative Experiments V1 to V3) procedure

| Example No. | | 1 | 2 | 3 |
|---|---|---|---|---|
| Organic developer: | | | | |
| Composition: | | | | |
| Hydrogenated mineral oil fraction | [% by wt.] | Ex[a] [80] | Ex[a] [100] | Ex[a] [98] |
| Alcohol | [% by wt.] | TMH[b] [20] | — | — |
| Antistatic agent | [ppm] | ASA3[d] [1] | ASA3[d] [1] | PA-10[f] [2] |
| Properties: | | | | |
| Odor | | Very slight | Odorless | Very slight |
| Flashpoint according to DIN (No.) | °C. | 60 (51 758) | 65 (51 758) | 63 (51 758) |
| Conductivity $\sigma$ | pS | 4500 | 4500 | 120 |
| Experimental results: | | | | |
| Optimal washout time | min | 13 | 10 | 10 |
| Drying time until initial layer thickness is reached | h | 2 | 2 | 2 |
| Drying time until tolerances of $\leq$ 20 μm are reached | h | 2 | 2 | 2 |
| Surface structures? | | None | None | None |
| Residues of top layer (C) present? | | No | — | — |
| Possibility of working up the organic developer by distillation under reduced pressure of 150 mbar and at 140° C.: | | Good; it is only necessary to meter in further antistatic agent | Good; it is only necessary to meter in further antistatic agent | Very good; it is not necessary to meter in further antistatic agent |
| Comparative Experiments | | V1 | V2 | V3 |
| Organic developer: | | | | |
| Composition: | | | | |
| Hydrogenated mineral oil fraction | [% by wt.] | Ex[a] [80] | Ex[a] [100] | Ex[a] [80] |
| Alcohol | [% by wt.] | EH[a] [20] | — | P[c] [20] |
| Antistatic agent | [ppm] [% by wt.] | — | — | — |
| Properties: | | | | |
| Odor | | Slight to faintly unpleasant | Odorless | Unpleasantly irritant |
| Flashpoint according to DIN (No.) | °C. | 62 (51 758) | 63 (51 758) | 46 (51 755) |
| Conductivity $\sigma$ | pS | 4 | 5 | 610 |
| Experimental results: | | | | |
| Optimal washout time | min | Development was terminated because pronounced electrostatic charging occurred under the selected conditions | As for Comparative Experiment V2 | 13 |
| Drying time until initial layer thickness is reached | h | | | 2 |
| Drying time until tolerances of $\leq$ 20 μm are reached | h | | | 2.5 |
| Surface structures? | | | | None |
| Residues of top layer (C) present? | | | | No |
| Possibility of working up the organic developer by distillation under reduced pressure of 150 mbar and at 140° C.: | | | | Poor, alcohol content must be determined, further Ex[a] must be metered in |
| Comparative Experiments | | V1 | V2 | V3 |

The experimental results underline the advantageous nature of the organic developers used according to the invention: owing to their high flashpoint, they do not constitute as high a safety risk as the conventional developers. Because of their moderate odor, they do not annoy the operator of the drum brush washer to the same extent as some of the conventionally used developers. The developers to be used according to the invention had an electrical conductivity which, form the safety point of view, was sufficient to circulate them in the washers at high speed or to spray them at high spray pressure. In contrast, when known developers were used under exactly comparable conditions, the electrostatic charge which resulted in some cases was so high that the experiments were terminated for safety reasons. Moreover, the organic developers to be used according to the invention can be worked up in a simple manner and reused for the novel process. The drying times were short and met practical requirements. Not least, the photopolymeric flexographic relief printing plates produced by the novel procedure had no residues of alcohol-soluble top layer (C) and no orange peel.

We claim:

1. A process for the production of a photopolymeric flexographic relief printing plate from a photosensitive recording element which contains
   A) a dimensionally stable substrate and
   B) a least one photopolymerizable recording layer having
      b1) at least one elastomeric polymer as a binder,
      b2) at least one photopolymerizable monomer which is compatible with the binder (b1) and
      b3) at least one photopolymerizable initiator,
   which comprises:
   (1) image-wise exposing the photopolymerizable recording layer (B) to actinic light, and
   (2) washing out the unexposed and therefore non-photopolymerized parts of the image-wise exposed recording layer (B) with an organic developer with the formation of a relief layer,
   wherein the organic developer contains from 1 pphm (1 part per 100,000,000) to 3% by weight, based on its total amount, of at least one compound selected from the group consisting of alkali metal, alkaline earth metal and transition metal salts of amino carboxylic acids as an antistatic agent.

2. The process of claim 1, wherein the organic developer is poorly flammable, nonflammable and/or high boiling.

3. The process of claim 1, wherein the organic developer has an electrical conductivity $\sigma$ of $\geq 100$ Ps.

4. The process of claim 1, wherein the organic developer contains at least one mineral oil fraction from which aromatics have been removed.

5. The process of claim 1, wherein a mixture of chromium anthranilate and calcium semialanate is used as the antistatic agent.

6. The process of claim 1, wherein the organic developer contains at least one of (1) virtually odorless saturated alcohol, whose boiling point or boiling range is matched with the boiling range of the organic developer and which has a branched alkyl radical in the molecule, or (2) benzyl alcohol.

7. The process of claim 6, wherein the alcohol is present in the organic developer in an amount of from 5 to 50% by volume.

8. The process of claim 6, wherein the saturated alcohol having a branched alkyl radical in the molecule is at least one of isoheptanol, isooctanol, isononanol, 3,5,5-trimethyl-hexanol, 2-ethylhexanol or an industrial mixture of saturated alcohols having a branched alkyl radical in the molecule.

* * * * *